United States Patent
Wu

(10) Patent No.: US 8,918,992 B2
(45) Date of Patent: Dec. 30, 2014

(54) CIRCUIT LAYER MANUFACTURING METHOD

(75) Inventor: Chu-Hsun Wu, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 240 days.

(21) Appl. No.: 13/557,237

(22) Filed: Jul. 25, 2012

(65) Prior Publication Data

US 2013/0215566 A1 Aug. 22, 2013

(30) Foreign Application Priority Data

Feb. 22, 2012 (TW) .............................. 101105799 A

(51) Int. Cl.
*H01K 3/10* (2006.01)

(52) U.S. Cl.
USPC .................. 29/852; 29/825; 29/830; 29/832; 361/683; 361/586

(58) Field of Classification Search
CPC ........ H01L 23/36; H01L 23/42; H01L 23/485
USPC ............. 29/830, 832, 840, 841; 361/683, 686
See application file for complete search history.

(56) References Cited

U.S. PATENT DOCUMENTS

| | | | |
|---|---|---|---|
| 5,550,710 A * | 8/1996 | Rahamim et al. | 361/679.41 |
| 6,049,973 A * | 4/2000 | Frank et al. | 29/830 |
| 6,297,955 B1 * | 10/2001 | Frank et al. | 361/679.41 |
| 6,483,719 B1 * | 11/2002 | Bachman | 361/816 |
| 7,013,558 B2 * | 3/2006 | Bachman | 29/832 |
| 8,009,431 B2 * | 8/2011 | Sun et al. | 361/727 |
| 2011/0248952 A1 | 10/2011 | Wang | |

FOREIGN PATENT DOCUMENTS

TW 201135692 A1 10/2011

OTHER PUBLICATIONS

Office action mailed on Oct. 9, 2013 for the Taiwan application No. 101105799, filing date: Feb. 22, 2012, p. 1 line 13~14, p. 2 line 1~21 and line 23~26, p. 3 line 1~3, line 5~9 and line 11~17 and search report.

* cited by examiner

*Primary Examiner* — Carl Arbes
(74) *Attorney, Agent, or Firm* — Winston Hsu; Scott Margo

(57) ABSTRACT

A circuit layer manufacturing method is applied to a portable computer. The portable computer includes a front bezel, a display module, and a back cover. The front bezel is connected to the back cover for containing the display module. The front bezel includes a metal portion. The metal portion has a flat region corresponding to a side of the back cover. The circuit layer manufacturing method includes forming at least one control circuit layer assembly on the flat region, grounding the control circuit layer assembly to the flat region, and forming a protection layer on the control circuit layer assembly. The control circuit layer assembly includes an insulation layer and a control circuit layer. The control circuit layer is electrically connected to the display module. The insulation layer is formed between the control circuit layer and the flat region for being alternately stacked with the control circuit layer.

15 Claims, 5 Drawing Sheets

CIRCUIT LAYER MANUFACTURING METHOD

BACKGROUND OF THE INVENTION

1. Field of the Invention

The present invention relates to a circuit layer manufacturing method and a portable computer thereof, and more specifically, to a circuit layer manufacturing method of directly forming a circuit layer of a circuit board on a flat metal region of a front bezel of a portable computer to omit a substrate of the circuit board and a portable computer thereof.

2. Description of the Prior Art

With development of electronic technology, portable electronic apparatuses have made great progress on portability, and a tablet computer is one of the most representative examples.

Generally speaking, in an assembly process of a tablet computer, first of all, a front bezel is utilized to hold a display device (e.g. a liquid crystal display panel) and a touch device, and a control circuit board and the front bezel with the display device and the touch device installed thereon are then installed on a back cover. Accordingly, the assembly process of the tablet computer is completed.

However, since the overall thickness of the control circuit board (including a substrate and a circuit layer formed on the substrate) is usually greater than 2.5 mm, the aforesaid assembly design is therefore disadvantageous to a slim design of the tablet computer and limits the structural design of the tablet computer and flexibility of the tablet computer in use of its inner space. Besides, in order to prevent EMI (Electromagnetic Interference) or ESD (Electrostatic Discharge) damage, a conductive fabric, a copper foil, or an aluminum foil is usually needed to attach to the control circuit board for grounding. Plus, the control circuit board is usually fixed onto the front bezel in a screw locking manner. Thus, the aforesaid assembly design not only increases the component cost of the tablet computer in disposal of the control circuit board, but also causes a time-consuming and strenuous assembly process.

SUMMARY OF THE INVENTION

An objective of the present invention is to provide a circuit layer manufacturing method of directly forming a circuit layer of a circuit board on a flat metal region of a front bezel of a portable computer to omit a substrate of the circuit board and a portable computer thereof for solving the aforesaid problem.

The present invention provides a circuit layer manufacturing method applied to a portable computer. The portable computer includes a front bezel, a display module, and a back cover. The front bezel is connected to the back cover for containing the display module and includes a metal portion. A side of the metal portion having a flat region corresponding to the back cover. The circuit layer manufacturing method includes forming at least one control circuit layer assembly on the flat region, grounding the control circuit layer assembly to the flat region, and forming a protection layer on the control circuit layer assembly. The control circuit layer assembly includes an insulation layer and a control circuit layer. The control circuit layer is electrically connected to the display module. The insulation layer is formed between the control circuit layer and the flat region for being alternately stacked with the control circuit layer.

According to the claimed invention, the circuit layer manufacturing method further includes utilizing a punching process or a casting process to form the front bezel.

According to the claimed invention, grounding the control circuit layer assembly to the flat region includes utilizing a through hole process to ground the control circuit layer assembly to the flat region.

According to the claimed invention, forming at least one control circuit layer assembly on the flat region includes utilizing a resin coating process to form the insulation layer.

According to the claimed invention, forming at least one control circuit layer assembly on the flat region includes performing an etching process on the insulation layer to form the control circuit layer assembly on the insulation layer.

According to the claimed invention, forming the protection layer on the control circuit layer assembly includes performing a painting process on the control circuit layer assembly to form the protection layer on the control circuit layer.

According to the claimed invention, the front bezel further includes a plastic portion and the circuit layer manufacturing method further includes utilizing an insert molding process to connect the metal portion to the plastic portion for forming the front bezel.

The present invention further provides a portable computer. The portable computer includes a display module, a back cover, a front bezel, and a circuit layer portion. The front bezel is connected to the back cover to contain the display module and includes a metal portion. A side of the metal portion corresponding to the back cover has a flat region. The circuit layer portion is electrically connected to the display module. The circuit layer portion includes at least one control circuit layer assembly and a protection layer. The control circuit layer assembly is formed on the flat region and includes a control circuit layer and an insulation layer. The control circuit layer is grounded to the flat region for controlling the display module. The insulation layer is formed between the control circuit layer and the flat region for being alternately stacked with the control circuit layer. The protection layer is formed on the control circuit layer assembly.

According to the claimed invention, the front bezel is formed by a punching process or a casting process.

According to the claimed invention, the control circuit layer is grounded to the flat region by a through hole process.

According to the claimed invention, the front bezel further includes a plastic portion, and the metal portion is connected to the plastic portion by an insert molding process for cooperatively forming the front bezel.

In summary, the present invention utilizes the design in which the circuit layer of the circuit board is directly formed on the flat region of the front bezel of the portable computer, to achieve the purpose of omitting the substrate of the circuit board. In such a manner, the present invention can efficiently reduce space in the portable computer occupied by the circuit board, so as to reduce the overall thickness of the portable computer and increase flexibility of the portable computer in use of its inner space. In addition, since the circuit board can be fixed to the front bezel without screws and the control circuit layer can be directly grounded to the flat region by a through hole process, the present invention can further decrease the component cost of the portable computer in disposal of the circuit board and simplify the assembly process of the portable computer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
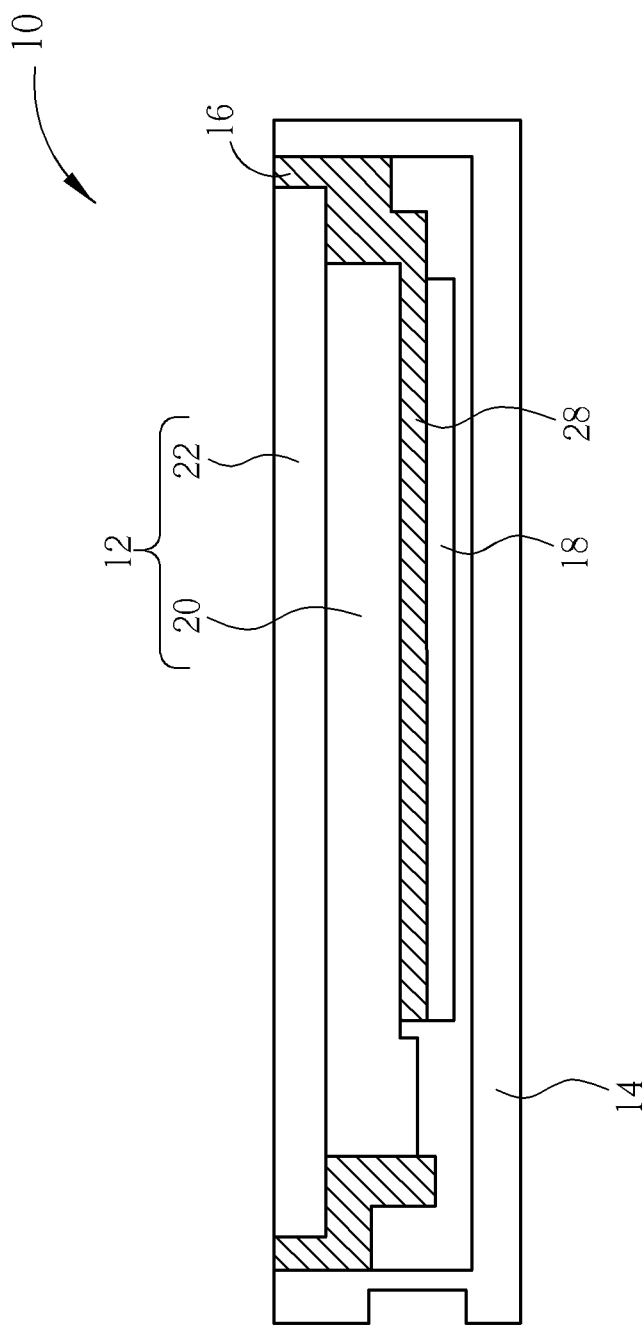
FIG. 1 is an inner front view of a portable computer according to an embodiment of the present invention.

Please refer to FIG. 1, which is an inner front view of a portable computer 10 according to an embodiment of the present invention. As shown in FIG. 1, the portable computer 10 includes a display module 12, a back cover 14, a front bezel 16, and a circuit layer portion 18. The portable computer 10 can be a tablet computer, but not limited thereto, meaning that the portable computer 10 can also be other type of portable computer device, such as a notebook. In this embodiment, the display module 12 can include a display device 20 and a touch panel 22 (but not limited thereto). The display device 20 is disposed on the front bezel 16 for displaying images. The touch panel 22 is disposed on the display device 20 for providing a touch function. The front bezel 16 is connected to the back cover 14 for cooperatively containing the display module 12.

Figure 2:
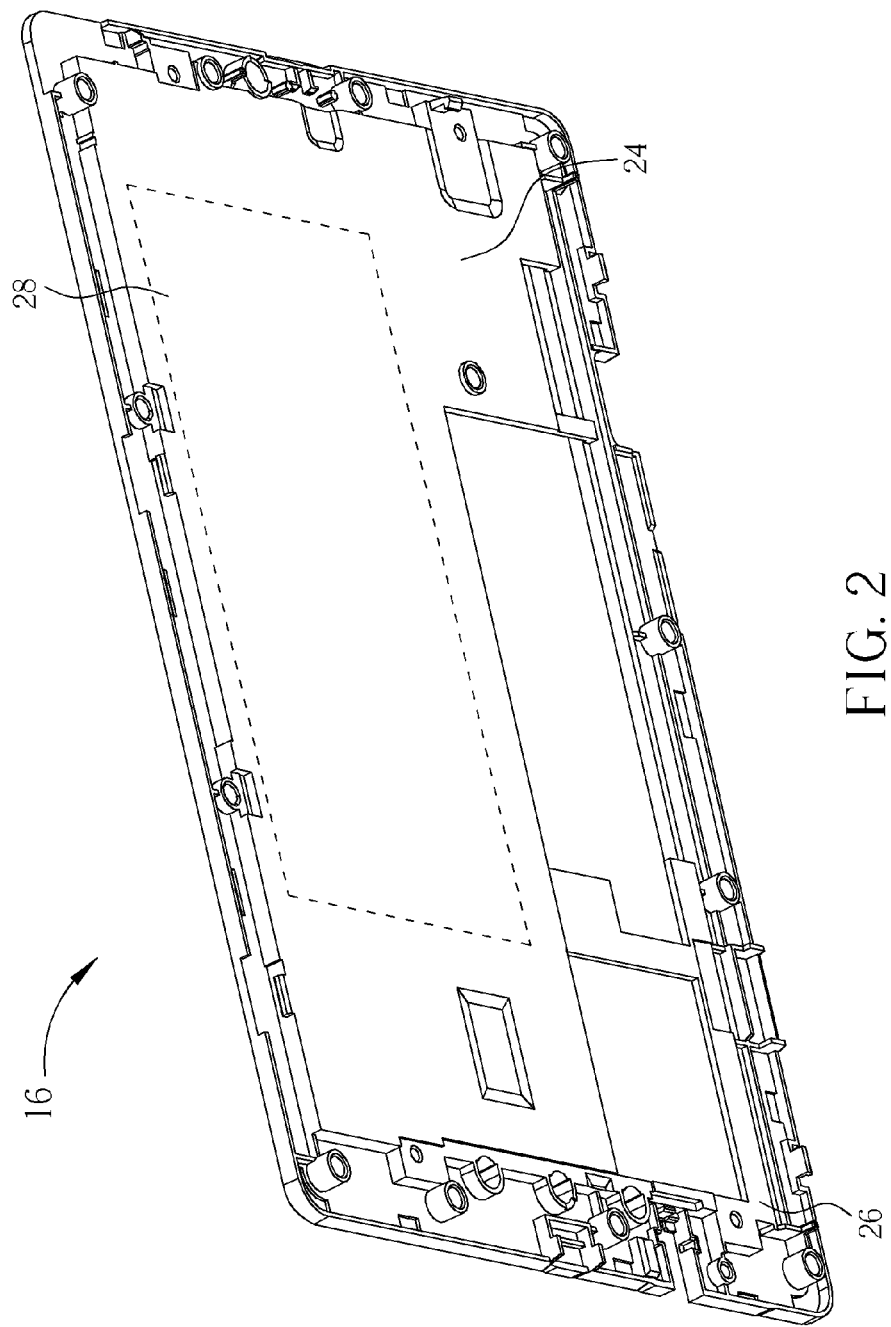
FIG. 2 is a diagram of a front bezel in FIG. 1.

Next, please refer to FIG. 1 and FIG. 2. FIG. 2 is a diagram of the front bezel 16 in FIG. 1. As shown in FIG. 1 and FIG. 2, the front bezel 16 includes a metal portion 24 and a plastic portion 26. The metal portion 24 is connected to the plastic portion 26 by an insert molding process for cooperatively forming the front bezel 16. A side of the metal portion 24 corresponding to the back cover 14 has a flat region 28 for providing the circuit layer portion 18 with sufficient forming space.

Figure 3:
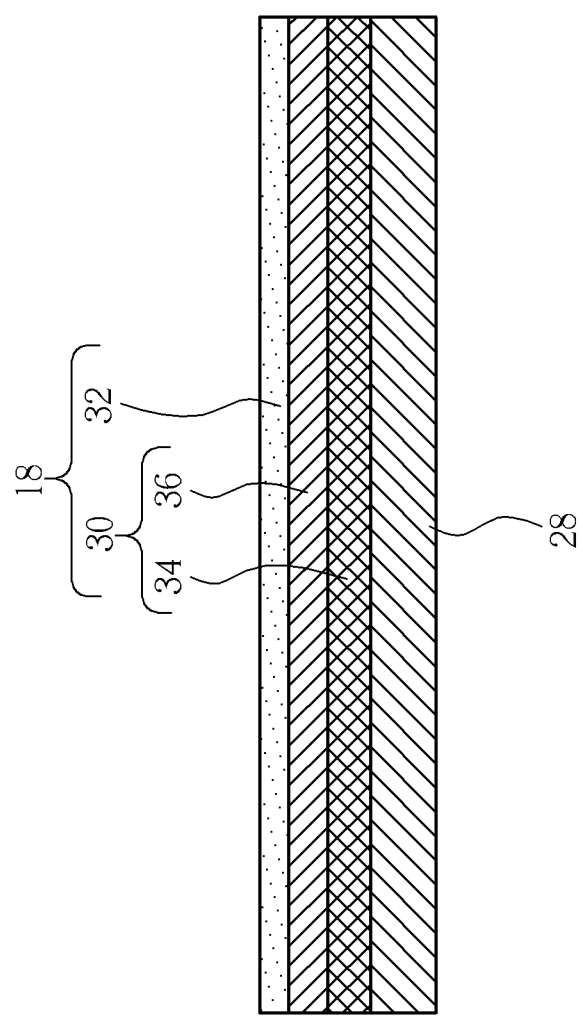
FIG. 3 is a front view of a circuit layer portion in FIG. 1.

As for the design of the circuit layer portion 18, it can be as shown in FIG. 1 and FIG. 3. FIG. 3 is a front view of the circuit layer portion 18 in FIG. 1. The circuit layer portion 18 includes at least one control circuit layer assembly 30 (one shown in FIG. 3) and a protection layer 32. The protection layer 32 is formed on the control circuit layer assembly 30 for circuit protection. The control circuit assembly 30 is formed on the flat region 28. The control circuit layer assembly 30 includes an insulation layer 34 and a control circuit layer 36. The insulation layer 34 is formed between the control circuit layer 36 and the flat region 28 for being alternately stacked with the control circuit layer 36. The control circuit layer 36 is grounded to the flat region 28 for preventing EMI or ESD damage. Furthermore, the control circuit layer 36 is electrically connected to the display module 12 for controlling the display module 12 (e.g. controlling the display module 12 to display images). Accordingly, via the design in which the control circuit layer assembly 30 is formed on the flat region 28 and the protection layer 32 is formed on the control circuit layer assembly 30, a corresponding four-layer circuit board can be directly formed on the front bezel 16 (as shown in FIG. 3).

Figure 4:
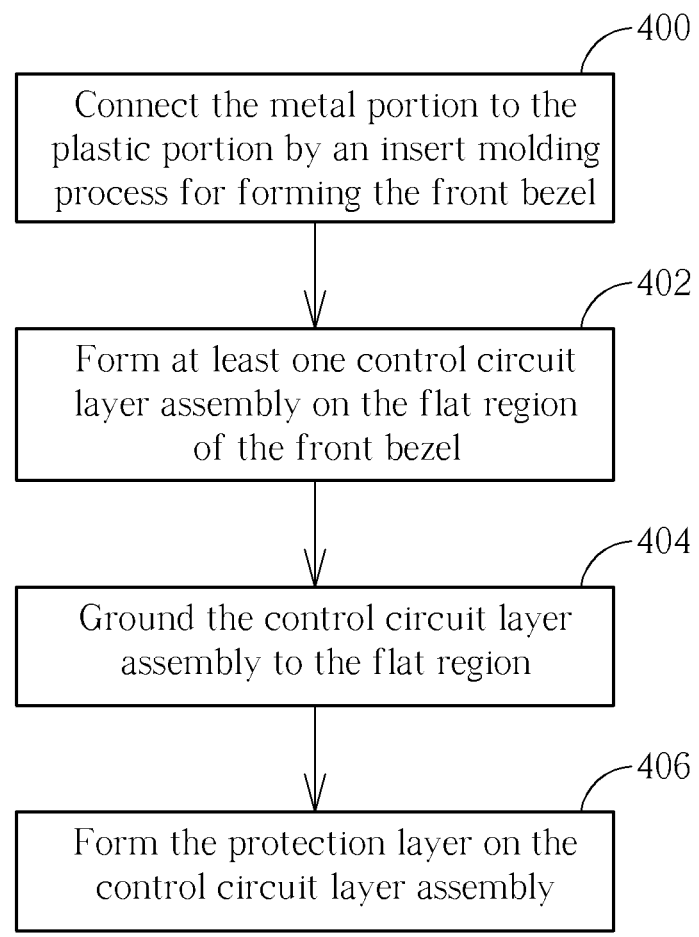
FIG. 4 is a flowchart of a circuit layer manufacturing method according to an embodiment of the present invention.

More detailed description for the forming process of the circuit layer portion 18 of the portable computer 10 is provided as follows. Please refer to FIG. 1, FIG. 2, FIG. 3, and FIG. 4. FIG. 4 is a flowchart of a circuit layer manufacturing method according to an embodiment of the present invention. The circuit layer manufacturing method includes the following steps.

Step 400: Connect the metal portion 24 to the plastic portion 26 by an insert molding process for forming the front bezel 16;
Step 402: Form the control circuit layer assembly 30 on the flat region 28 of the front bezel 16;
Step 404: Ground the control circuit layer assembly 30 to the flat region 28;
Step 406: Form the protection layer 32 on the control circuit layer assembly 30.

The aforesaid steps are described in details herein. First of all, an insert molding process can be utilized to connect the metal portion 24 and the plastic portion 26, so as to make the metal portion 24 and the plastic portion 26 formed integrally for forming the front bezel 16 (Step 400). Subsequently, in Step 402, the control circuit layer assembly 30 can be formed on the flat region 28 of the metal portion 24 of the front bezel 16 after the front bezel 16 is formed. To be noted, before the control circuit layer 36 of the control circuit layer assembly 30 is formed on the flat region 28, the insulation layer 34 of the control circuit layer assembly 30 needs to be formed on the flat region 28 in advance for making the control circuit layer 36 electrically insulated from the flat region 28. In this embodiment, the insulation layer 34 can be formed on the flat region 28 by a resin coating process, meaning that the insulation layer 34 can be formed by utilizing a coating machine to coat insulation resin on the flat region 28.

Subsequently, adhesive glues are utilized to stick a substrate for forming the control circuit layer 36 (e.g. a copper foil layer) on the insulation layer 34, and an etching process is then utilized to etch a corresponding circuit pattern on the substrate for forming the control circuit layer 36. In such a manner, the forming process of the control circuit layer assembly 30 can be completed accordingly. It should be mentioned that number of layers of the control circuit layer assembly 30 is not limited to one as shown in FIG. 3. In other words, in another embodiment, plural control circuit layer assemblies 30 can be formed on the flat region 28 (i.e. plural insulation layers 34 are alternately stacked with plural control circuit layers 36), so as to achieve the purpose of forming a multi-layer circuit on the flat region 28.

Furthermore, since the front bezel 16 is in contact with the outer environment directly as shown in FIG. 1, the front bezel 16 can be regarded as a ground level. Thus, after Step 402 is completed, the control circuit layer assembly 30 can be grounded to the flat region 28 by a through hole process (Step 404), but not limited thereto, meaning that the present invention can also utilize other grounding design commonly seen in the prior art (e.g. utilizing a conductive fabric, a copper foil, or an aluminum foil to ground the control circuit layer 36 to the flat region 28).

Finally, after the protection layer 32 is formed on the control circuit layer 36 by a painting process for circuit protection and insulation (Step 406), the forming process of the circuit layer portion 18 is completed accordingly. As for the related descriptions of the resin coating process, the etching process, the through hole process, and the painting process mentioned in the aforesaid steps, they are commonly seen in the prior art and therefore omitted herein. Furthermore, the forming processes of the insulation layer 34, the control circuit layer 36, and the protection layer 32 and the integrally-forming process of the metal portion 24 and the plastic portion 26 are not limited to the aforesaid embodiment. In other words, all the forming processes having the same effect may be adopted by the present invention.

Figure 5:
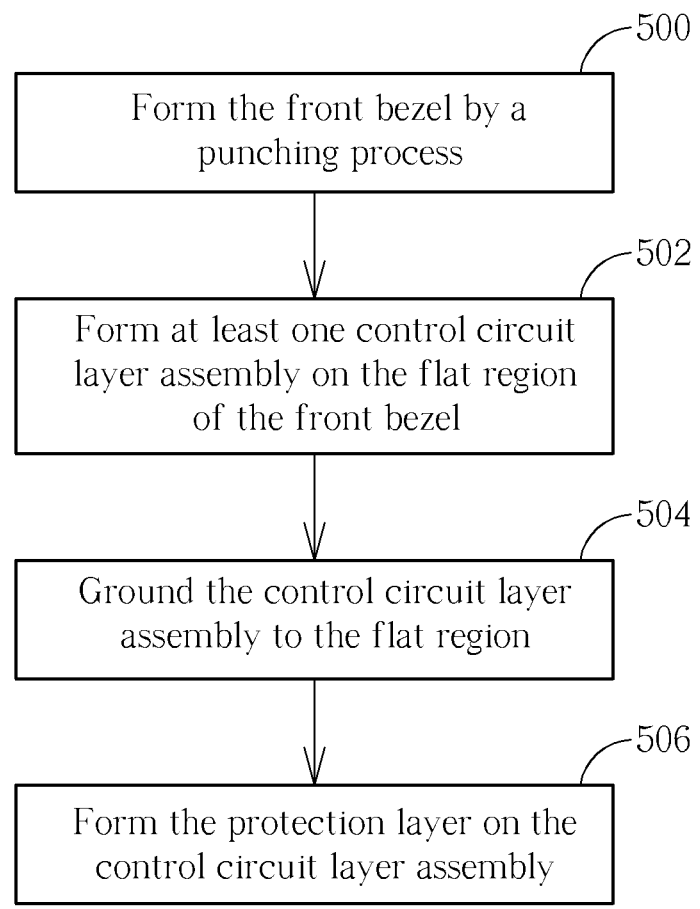
FIG. 5 is a flowchart of a circuit layer manufacturing method according to another embodiment of the present invention.

It should be mentioned that the forming process of the front bezel 16 is not limited to the insert molding process mentioned in the aforesaid embodiment. For example, please refer to FIG. 5, which is a flowchart of a circuit layer manufacturing method according to another embodiment of the present invention. As shown in FIG. 5, since the major difference between this embodiment and the aforesaid embodiment is Step 500, Step 500 is only described in details as follows. As for the other steps, they are the same as the steps in FIG. 4 and the related description is omitted herein for simplicity. In this embodiment, the front bezel 16 is a full-metal structure. Thus, the front bezel 16 can be formed by a punching process, but not limited thereto, meaning that the present invention can also utilize other forming process to form the full-metal front bezel 16 (e.g. a casting process).

Compared with the prior art, the present invention utilizes the design in which the circuit layer of the circuit board is directly formed on the flat region of the front bezel of the portable computer, to achieve the purpose of omitting the substrate of the circuit board. In such a manner, the present invention can efficiently reduce space in the portable computer occupied by the circuit board, so as to reduce the overall thickness of the portable computer and increase flexibility of the portable computer in use of its inner space. In addition, since the circuit board can be fixed to the front bezel without screws and the control circuit layer can be directly grounded to the flat region by a through hole process, the present invention can further decrease the component cost of the portable computer in disposal of the circuit board and simplify the assembly process of the portable computer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit layer manufacturing method applied to a portable computer, the portable computer comprising a front bezel, a display module, and a back cover, the front bezel being connected to the back cover for containing the display module and comprising a metal portion, a side of the metal portion having a flat region corresponding to the back cover, the circuit layer manufacturing method comprising:
   directly forming at least one control circuit layer assembly on the flat region;
   grounding the control circuit layer assembly to the flat region; and
   forming a protection layer on the control circuit layer assembly;
   wherein the control circuit layer assembly comprises an insulation layer and a control circuit layer, the control circuit layer is electrically connected to the display module, and the insulation layer is directly formed on the metal portion, and the control circuit layer is directly formed on the insulation layer to make the control circuit layer alternately stacked with the insulation layer on the metal portion.

2. The circuit layer manufacturing method of claim 1 further comprising:
   utilizing a punching process or a casting process to form the front bezel.

3. The circuit layer manufacturing method of claim 2, wherein grounding the control circuit layer assembly to the flat region comprises:
   utilizing a through hole process to ground the control circuit layer assembly to the flat region.

4. The circuit layer manufacturing method of claim 3, wherein forming at least one control circuit layer assembly on the flat region comprises:
   utilizing a resin coating process to form the insulation layer.

5. The circuit layer manufacturing method of claim 4, wherein forming at least one control circuit layer assembly on the flat region comprises:
   performing an etching process on the insulation layer to form the control circuit layer assembly on the insulation layer.

6. The circuit layer manufacturing method of claim 5, wherein forming the protection layer on the control circuit layer assembly comprises:
   performing a painting process on the control circuit layer assembly to form the protection layer on the control circuit layer.

7. The circuit layer manufacturing method of claim 3, wherein forming at least one control circuit layer assembly on the flat region comprises:
   performing an etching process on the insulation layer to form the control circuit layer assembly on the insulation layer.

8. The circuit layer manufacturing method of claim 7, wherein forming the protection layer on the control circuit layer assembly comprises:
   performing a painting process on the control circuit layer assembly to form the protection layer on the control circuit layer.

9. The circuit layer manufacturing method of claim 1, wherein the front bezel further comprises a plastic portion, and the circuit layer manufacturing method further comprises:
   utilizing an insert molding process to connect the metal portion to the plastic portion for forming the front bezel.

10. The circuit layer manufacturing method of claim 9, wherein grounding the control circuit layer assembly to the flat region comprises:
    utilizing a through hole process to ground the control circuit layer assembly to the flat region.

11. The circuit layer manufacturing method of claim 10, wherein forming at least one control circuit layer assembly on the flat region comprises:
    utilizing a resin coating process to form the insulation layer.

12. The circuit layer manufacturing method of claim 11, wherein forming at least one control circuit layer assembly on the flat region comprises:
    performing an etching process on the insulation layer to form the control circuit layer assembly on the insulation layer.

13. The circuit layer manufacturing method of claim 12, wherein forming the protection layer on the control circuit layer assembly comprises:
    performing a painting process on the control circuit layer assembly to form the protection layer on the control circuit layer.

14. The circuit layer manufacturing method of claim 10, wherein forming at least one control circuit layer assembly on the flat region comprises:
    performing an etching process on the insulation layer to form the control circuit layer assembly on the insulation layer.

15. The circuit layer manufacturing method of claim 14, wherein forming the protection layer on the control circuit layer assembly comprises:
    performing a painting process on the control circuit layer assembly to form the protection layer on the control circuit layer.

* * * * *